United States Patent [19]

Sickles

[11] Patent Number: 4,600,231
[45] Date of Patent: Jul. 15, 1986

[54] CARRIER FOR SELF-SUPPORTING SHEET-LIKE ARTICLES SUCH AS PRINTED CIRCUIT BOARDS

[75] Inventor: Willard J. Sickles, Mill City, Pa.

[73] Assignee: InterMetro Industries Corp., Wilkes-Barre, Pa.

[21] Appl. No.: 632,229

[22] Filed: Jul. 19, 1984

[51] Int. Cl.⁴ .............................................. B25H 3/04
[52] U.S. Cl. .................................... 294/161; 211/41; 211/194; 294/143
[58] Field of Search ............... 294/142, 143, 159–163, 294/168; 206/509–511, 513; 211/40, 41, 49 R, 126, 175, 181, 184, 186–189, 194, 207; 220/19; 361/415

[56] References Cited

U.S. PATENT DOCUMENTS

| | | | |
|---|---|---|---|
| 1,902,338 | 3/1933 | Riley | 294/143 X |
| 3,014,594 | 12/1961 | Kerstner | 211/41 |
| 3,202,295 | 8/1965 | Drader | 211/126 |
| 3,349,924 | 10/1967 | Maurer et al. | 211/41 |
| 4,079,836 | 3/1978 | Stein et al. | 211/126 X |
| 4,385,781 | 5/1983 | Welsch et al. | 294/161 |
| 4,434,899 | 3/1984 | Rivkin | 211/41 |
| 4,511,194 | 4/1985 | Park et al. | 211/41 X |

FOREIGN PATENT DOCUMENTS 757815  5/1967  Canada ............................. 294/168

Primary Examiner—Johnny D. Cherry
Attorney, Agent, or Firm—Fitzpatrick, Cella, Harper & Scinto

[57] ABSTRACT

A carrier for self-supporting sheet-like articles such as printed circuit boards and the like comprises first and second frames and first and second spaced-apart panels supported by the frames. The panels are adapted to receive and support articles such as printed circuit boards, which can be inserted from the front of the carrier. The frames and the panels are connected in such a manner that the panels support the frames and provide front-to-back rigidity in the carrier, while the frames provide side-to-side rigidity.

7 Claims, 8 Drawing Figures

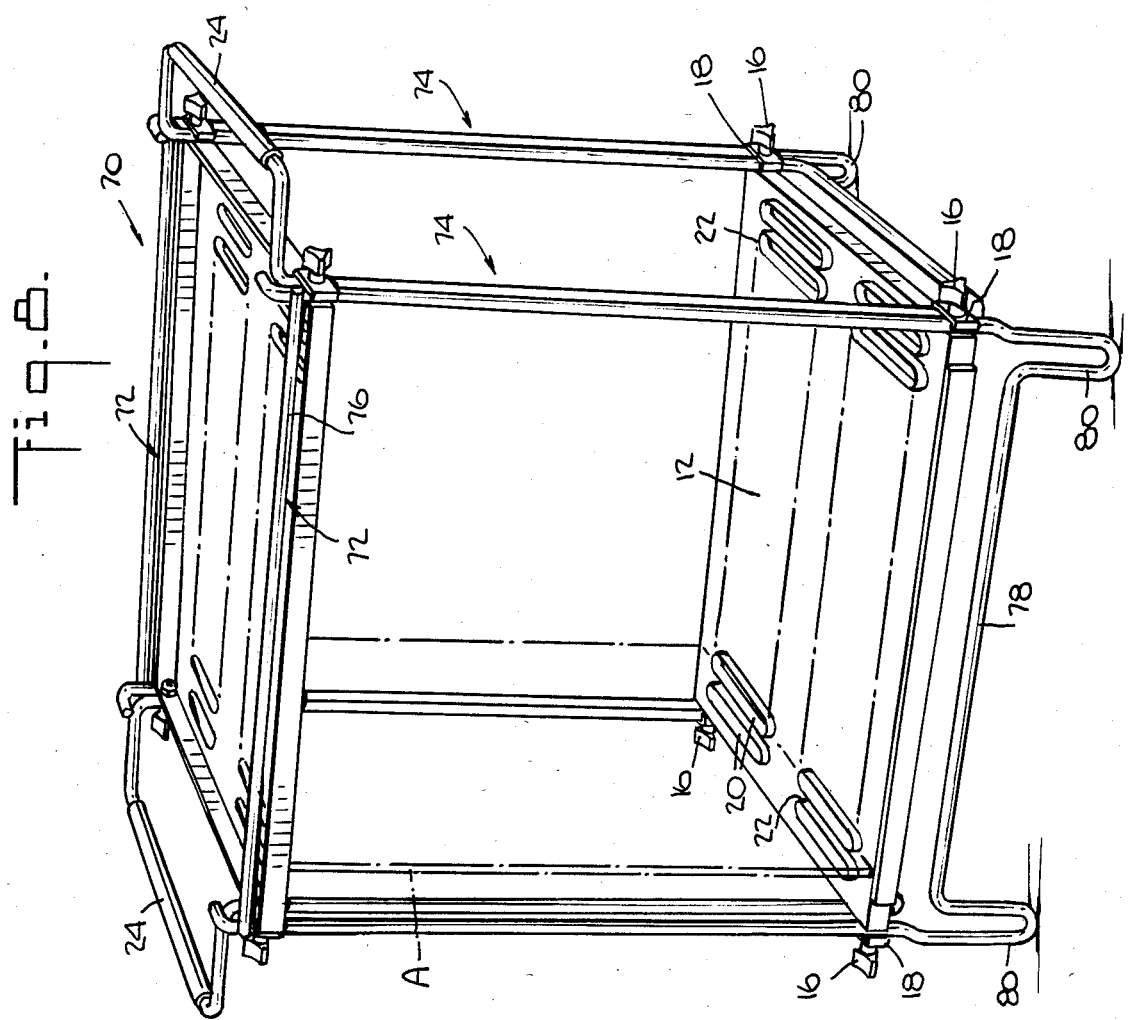
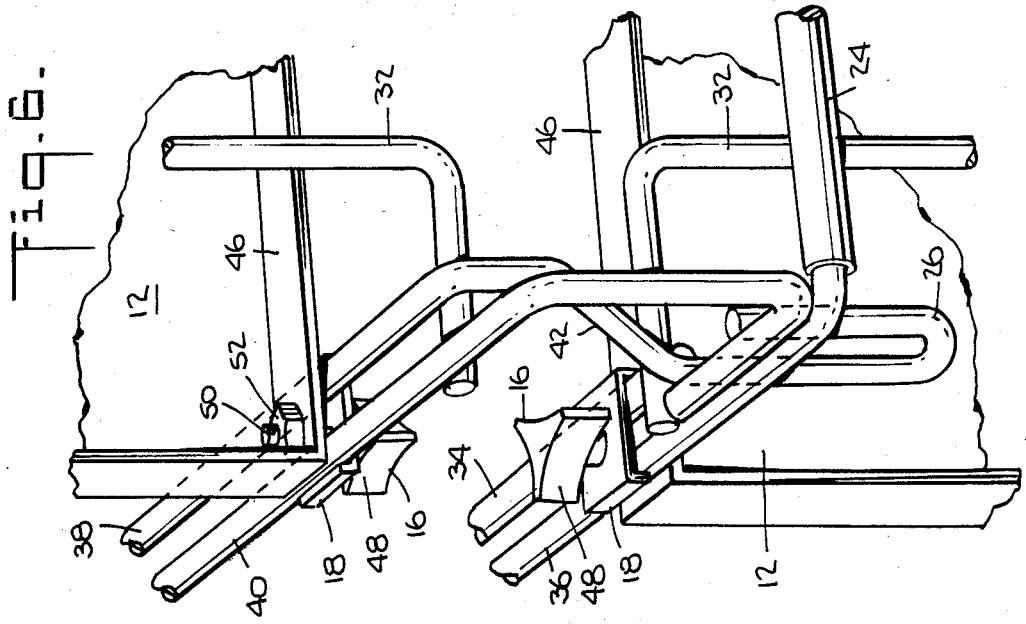

CARRIER FOR SELF-SUPPORTING SHEET-LIKE ARTICLES SUCH AS PRINTED CIRCUIT BOARDS

BACKGROUND OF THE INVENTION

1. Field of Invention

The present invention pertains generally to devices for carrying self-supporting sheet-like articles such as printed circuit boards and the like, and pertains more particularly to a printed circuit board carrier that is easy to manufacture and can be easily assembled and later disassembled for compact storage and transporting from point of manufacture to point of use. For purposes of this specification and the concluding claims, it is understood that the term "self-supporting sheet-like article" means a thin article having appreciable width and depth that can be supported generally horizontally at its edges without collapsing under its own weight and the weight of other objects that it is intended to carry.

Printed circuit boards (hereinafter "PCB's") are widely used in the electronics industry to support and interconnect electronic components and often need to be handled in batches of large numbers. It is, therefore, convenient to arrange PCB's in uniform stacks such that they are parallel to and uniformly spaced apart from each other, in order to minimize their stored or processed volume. PCB carriers designed to accommodate a number of boards so arranged can be stored, transported or otherwise handled as necessary, without handling of the individual PCB's in the carrier.

It is desirable for such carriers to be capable of being stacked upon one another vertically. It is also desirable to be able to transport such carriers manually, or to fix them in place simply and quickly in a truck or other vehicle for secure longer distance transport. Such carriers should also be light, durable, and preferably capable of disassembly for storage when not in use. In addition, carriers of this type should be designed to be supported in any of a number of ways, such as by resting on a shelf, or by being suspended.

Since PCB's are not all of the same size, it is also desirable to be able to adjust the size of a carrier to accommodate PCB's of different dimensions.

2. Description of the Prior Art

One carrier of the general type described above has been disclose in U.S. Pat. No. 4,385,781 (Welsch et al.), and assigned in common with the present application. While the carrier disclosed in that patent fulfills most of the above requirements, it has been found in some applications that it is desirable to provide the carrier, shown in the Welsch patent, with additional rigidity and stability. In particular, the carrier disclosed in the Welsch patent is reasonably rigid in the front-to-back direction, but is not as sturdy as desired for some purposes in the side-to-side direction.

SUMMARY OF THE INVENTION

Accordingly, it is the principal object of the present invention to provide a PCB carrier for self-supporting sheet-like articles such as PCB's and the like and having the desirable characteristics mentioned briefly above.

It is another object of the invention to provide such a carrier that is sturdy and displays great rigidity in all directions.

It is another object of the invention to provide such a carrier that can be vertically stacked on similar carriers.

The improved carrier of the present invention comprises first and second preferrably rectangular support frames and first and second rigid side panels. One frame is disposed at the front of the carrier and the other at the back, with both frames supporting the side panels in face-to-face relation. The side panels also support the frames and maintain the latter spaced apart from each other. The side panels include support elements, sometimes called card guides, for receiving and supporting articles such as PCB's inserted between the side panels from the front of the carrier toward the rear. The frames provide rigidity in the side-to-side direction that is required, while the side panels provide rigidity in the front-to-back direction.

The foregoing and other objects and advantages of the invention will be more clearly understood from a consideration of the following detailed description of several preferred embodiments, taken in conjunction with the accompanying figures, in which like reference characters denote like elements throughout.

BRIEF DESCRIPTION OF THE DRAWING

FIG. 6 is a detailed view of the carrier shown in FIG. 5, illustrating the engagement of the feet of the upper carrier with complementary portions of the lower carrier in the stack.

FIG. 8 is a perspective view of still another embodiment of the present invention, which is designed to store PCB's oriented vertically.

DETAILED DESCRIPTION OF THE PREFERRED EMBODIMENTS

Figure 1:
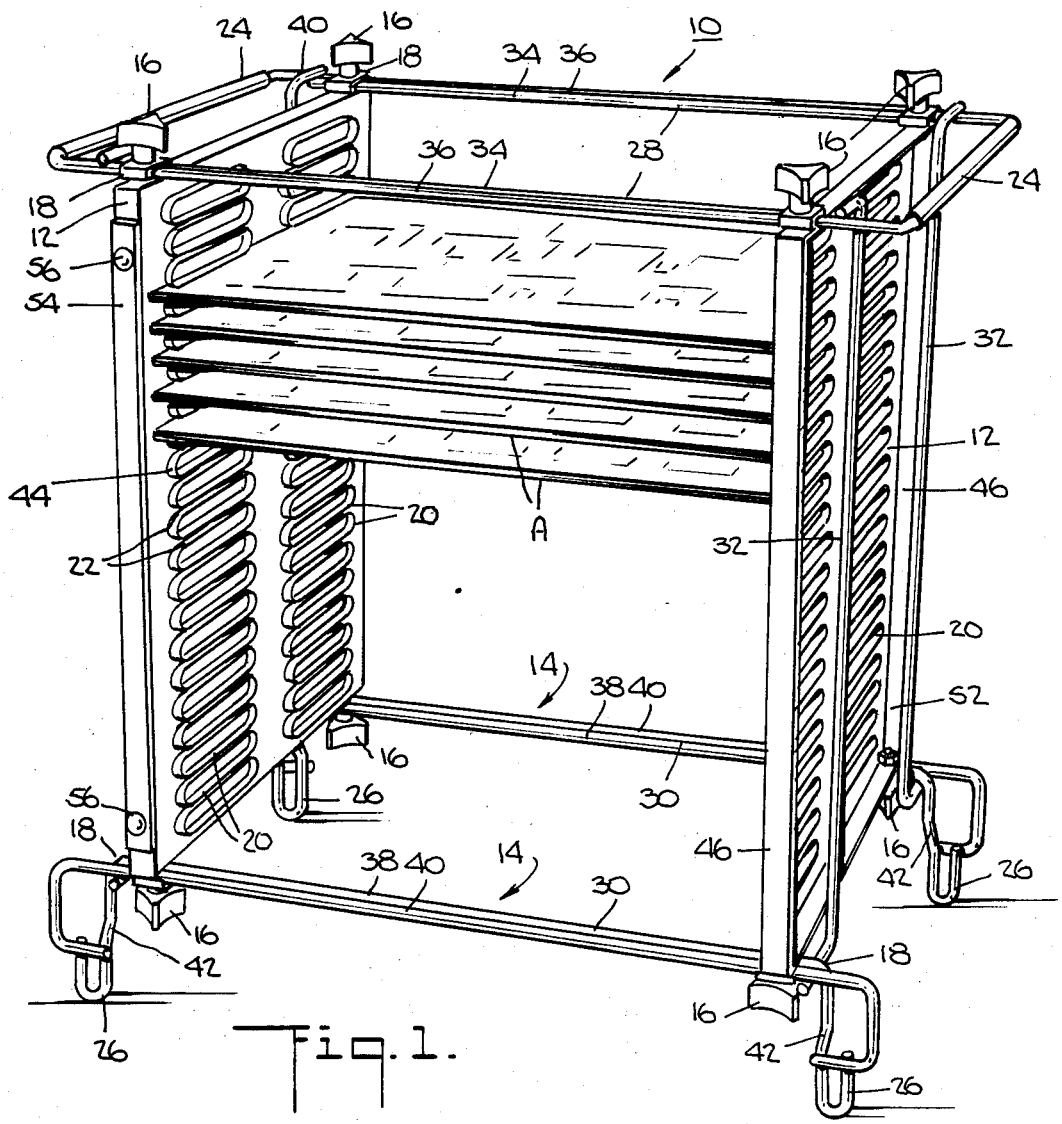
FIG. 1 is a perspective view of a first preferred embodiment of a carrier for self-supporting sheet-like articles according to the present invention, with several such articles in the form of printed circuit boards in place in the carrier.
Figure 3:
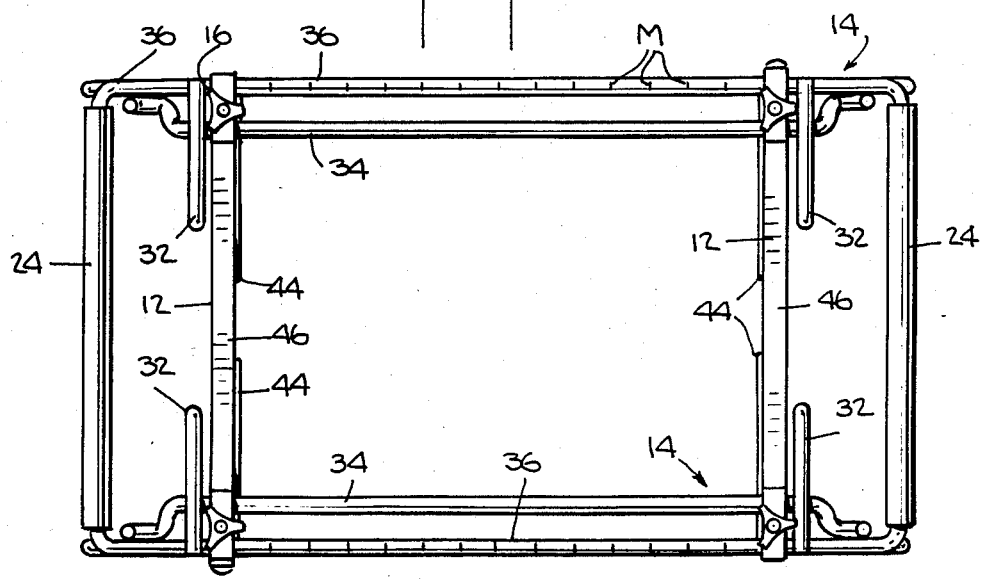
FIG. 3 is a top plan view of the carrier shown in FIG. 1.
Figure 2:
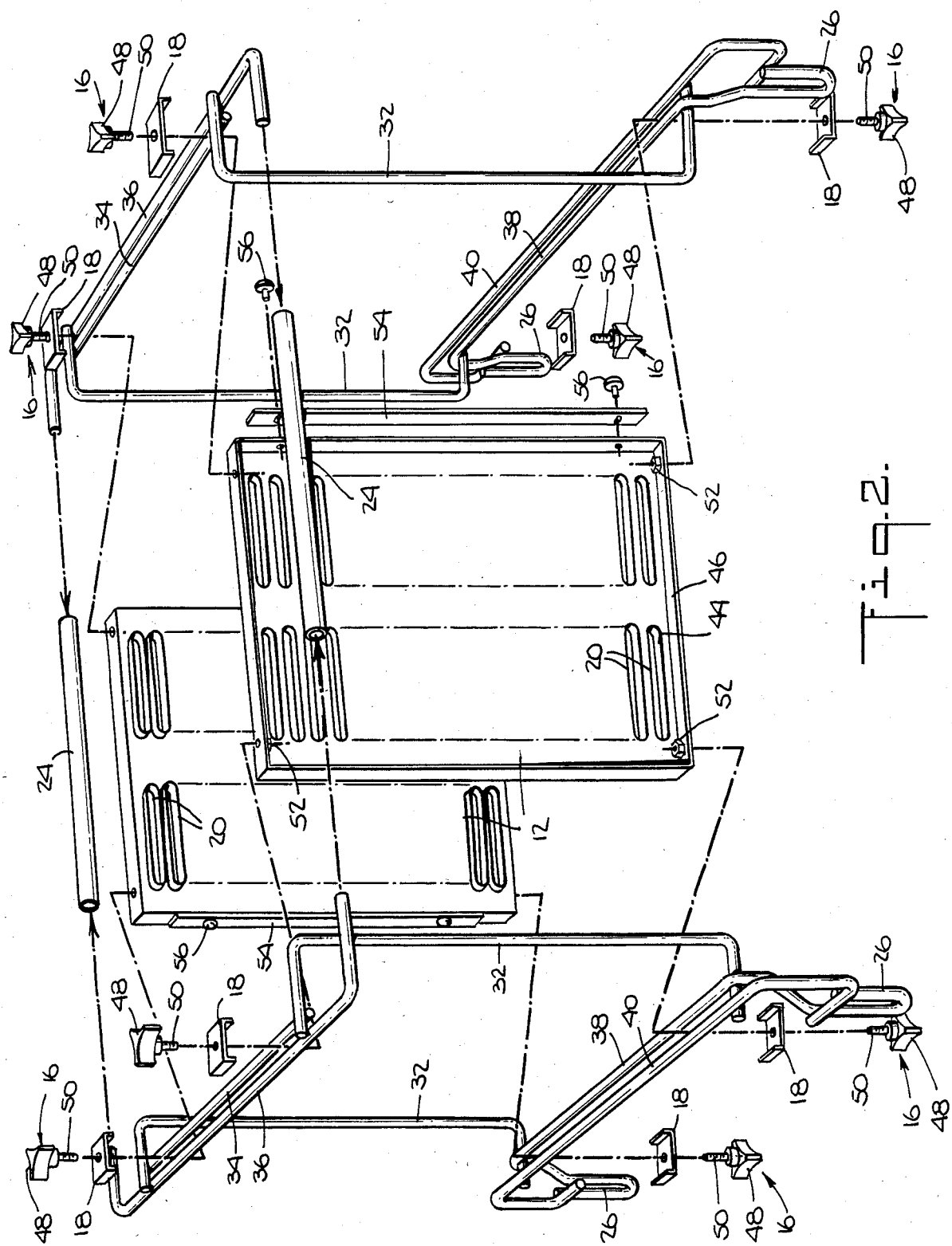
FIG. 2 is an exploded perspective view of the carrier shown in FIG. 1.

FIGS. 1, 2 and 3 show a first preferred embodiment of the carrier of the present invention for self-supporting articles such as PCB's and the like. For convenience, the following description will be made with reference to use of the carrier specifically for PCB's. However, it will be understood that this carrier may be used with equal advantage to store or otherwise support other "self-supporting, sheet-like" articles within the definition set forth above. In this first embodiment, the carrier 10 of the present invention generally includes first and second identical side panels 12 and first and second identical support frames 14. One support frame 14 is located at the front of the carrier, and the other at the back.

The front and back support frames 14 support the side panels 12 in face-to-face relation, spaced apart by a set, but adjustable, distance. The side panels 12, which in the embodiment illustrated are secured to the support frames 14 by screws 16 and associated brackets 18, also serve to hold the front and back support frames 14 spaced apart by a distance approximately equal to the width of the side panels 12.

As will be explained in greater detail below, the support frames 14 provide structural rigidity for the carrier in a side-to-side direction as seen in FIG. 1 and the side panels provide structural rigidity in the front-to back direction as seen in FIG. 1.

The side panels 12 are formed with card or board guides or louvers 20 that define horizontal slots 22 between them. PCB's can be slid into opposing slots 22 on opposing side panels 12 to be carried therebetween. Of course, the screws 16 and associated brackets 18 can be loosened and subsequently tightened to allow the side panels 12 to be clamped to the support frames 14 at any desirable location. This feature makes it possible to select the spacing between the panels 12 to accommodate PCB's A of various dimensions.

Two handles 24 are supported between the front and back support frames 14 at either side of the carrier 10 for easy carrying.

A downwardly extending foot 26 is provided at each corner of the bottom of the carrier 10. As will be explained in greater detail below, the feet 26 are shaped so as to nest securely in complementary portions of a second carrier of the same type, making it possible to vertically stack two or more carriers in a manner shown in FIG. 5.

The various components of the carrier 10 of the first embodiment of the present invention will now be described in greater detail.

Each of the two identical support frames 14 of the carrier 10 comprises an upper and a lower beam 28, 30 respectively, and two vertical side pieces 32. Each of the vertical side pieces 32 of each support frame 14 is a C-shaped metal wire in the illustrated first embodiment. This wire is straight in its central portion and is bent at each end to form an angle of about 90 degrees with the central portion. The bent portion at upper and lower ends is secured respectively to the upper surface of the top beam 28 and the lower surface of the bottom beam 30.

The top beam 28 of each support frame 14 preferably comprises parallel inner and outer rails 34, 36 that together define a horizontal plane and that are formed of metal wire in the illustrated first embodiment 10. The inner rail 34 is somewhat longer than the longest PCB that is to be accommodated by the carrier 10. The outer rail 36 is longer than the inner and extends in each direction beyond the latter. Both ends of the outer rail 36 are bent at about 90 degree angles to the major portion thereof in the direction toward the inner rail 34 and lying in the horizontal plane thereby to define a squared-off "C" shape. Both rails 34, 36 are secured, for example by welding, to the vertical side pieces 32. The parallel inner and outer rails 34, 36 thus form a track along which the panels 12 can be moved in a manner described further below.

The lower beam 30 of each frame also comprises two rails 38, 40, the major portion of each of which is straight. Both rails 38, 40 together define a generally horizontal plane and each is also of metal wire extending parallel to the other. The inner bottom rail 38 is bent downwardly at each end at about a 90 degree angle to the major portion thereof, to form a foot 26 generally in a vertical plane perpendicular to the horizontal plane. The very end of the bent-down portion is bent back upwardly through about 180 degrees so that the entire foot 26 has a "J" shape. The bottom of this "J" shape can rest on the surface supporting the carrier 10. The upper portion of the foot 26 is bent in a dog-leg shape at 42 so that the plane of the hook of the "J" shape is spaced slightly from the major portion of the vertical plane defined by the foot of inner rail 38.

Each end of the outer rail 40 is also bent downwardly at about 90 degrees, and the very end thereof is then bent through approximately an additional 90 degree angle so as to point toward the opposite end of the rail 40 and define a "C" shape in a vertical plane perpendicular to the horizontal plane. Each of the two end portions of the outer rail 40 is secured, for example by welding, to the hook portion of the foot 26 of the inner rail 38. The central straight portions of the two rails 38, 40 are spaced apart from each other in the horizontal plane and define a track like the track formed by the upper rails 34, 36 along which the side panels 12 can slide.

Each of the side panels 12 in the embodiment of FIG. 1 is preferably a substantially planar element, made of a sheet metal or another suitably rigid sheet-like material. Two or more parallel columns of identical horizontally extending oval louvers 20 are formed in each panel, for example, by stamping. Thus, each louver 20 is formed with a peripheral flange 44 that is substantially perpendicular to the plane of the side panel 12. The space between the flanges 44 of two adjacent louvers 20 in a column serves as a groove or slot 22 into which one edge of a PCB can be received. The louvers 20 are disposed so that the slots 22 extend from the front to the back of the carrier 10 in the embodiment of FIG. 1 and opposing louvers 20 in opposing panels 12 thereby define a plurality of parallel edge supports for PCB's.

The edges of each panel 12 are turned at about 90 degree angles to define a peripheral edge flange 46 extending from the back surface of the panels 44, i.e., from the surface opposite that on which the peripheral flanges 44 of the louvers 20 are formed. Screw assemblies cooperate with the upper and lower portions of the edge flange 46 of each side panel 12 to secure the panel to the support frames 14 in a manner described in detail below.

Figure 4:
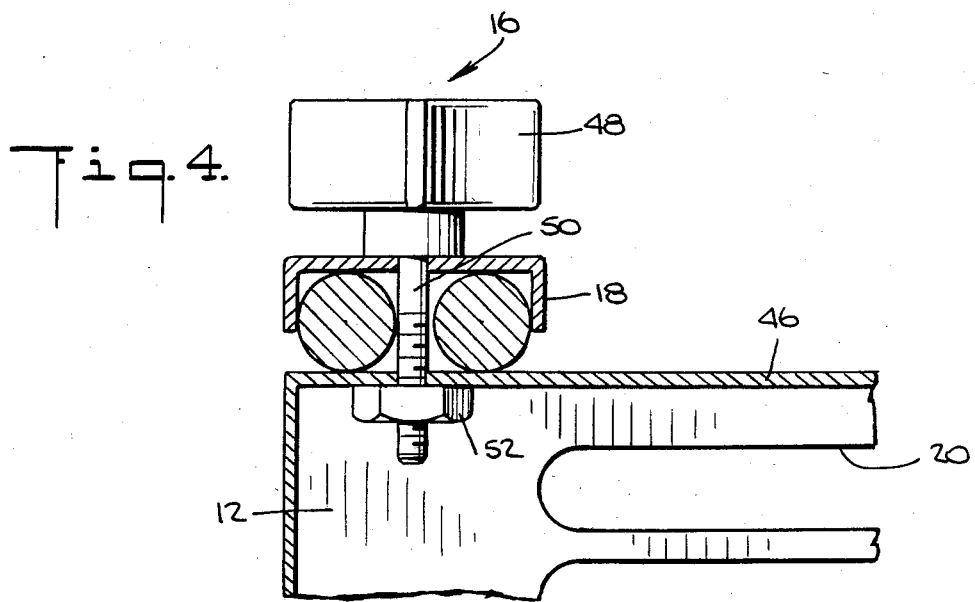
FIG. 4 is a detailed view of the carrier shown in FIG. 1, illustrating the manner of connecting the support frames to the side panels.

As can be most clearly seen in FIGS. 1 and 4, each screw assembly includes a screw 16 having a relatively large head 48 that is easy to manipulate and, which in the illustrated embodiment, is triangular, having three spokes extending radially from a central hub to afford an easy grip. Each screw 16 also has a threaded shaft 50 extending from the head 48, and a bracket or slide clamp 18 having a hole through it is engaged by the screw shaft 50. The slide clamp is shaped to fit over the two guide rails of either the top or the bottom beam of a support frame 14. The shaft 50 passes through the slide clamp 18 and through a hole in the flange 46 of the side panel 12 and is threadedly received in a nut 52 secured to the interior surface of flange 46. The screw 16 and nut 52 are used to secure the slide clamp 18, mounted on the rails, to the flange 46 of the side panels 12. The upper outer rails 36 are preferably provided with scale marks M (see FIG. 3) to aid in accurate positioning of the panels 12 along the rails.

This screw-clamp arrangement effectively secures the side panels 12 to the support frames 14, which thus hold the side panels 12 in position spaced apart from each other in face-to-face relation. The rigidity of the side panels 12 holds the two support frames 14 spaced apart from each other at a distance about equal to that between the front screw holes and the back screw holes in the top and bottom portions of the edge flanges 46 of the side panel 12.

By loosening the four screws 16 securing a panel 12 in place, it is possible to slide that panel along the beams 28, 30 of the frames 14 thus adjusting the spacing between the side panels 12. This adjustment makes it possible to accommodate PCB's of different lengths in the carrier 10.

To retain the PCB's in place in the carrier 10, a retainer strip 54 is provided on one side of the edge flange 46 of each side panel 12. One such retainer strip 54 is provided at the front of the carrier on one panel 12, and another strip 54 is provided at the back of the carrier on the other panel 12. Each strip 54 is secured to the side panel 12 by top and bottom rivets 56, which pass through apertures in the strip 54. The apertures are sufficiently large to allow each strip 54 to shift in a direction parallel to the top and bottom beams 28, 30 of the frames 14. One strip 54 is shown in a retracted position in FIG. 1, to allow PCB's to be inserted into or removed from the slots 22 of the side panels 12. When the PCB's have been loaded, the retainer strip 54 on each side panel 12 is slid toward the other side panel 12. Once this has been done, the retainer strips 54 act as stops to prevent the PCB's from falling out of the carrier 10.

Two handles 24 are provided on the carrier 10 of FIG. 1. Each handle 24 is a tubular element fitted over the inwardly bent ends of the upper outer guide rail 36 of each of the two frames 14. It will be appreciated that the handles 24, in addition to providing an easy means for gripping and lifting the carrier 10, can be used to suspend it for storage, and also provide extra rigidity in the front-to-back direction as well as provide for disassembly of the carrier 10 for compact storage or shipment.

It will also be appreciated that the two frames 14 provide rigidity for the assembled carrier 10 of the invention in the side-to-side direction as seen in FIG. 1. That is, each frame 14 is a rigid rectangular structure comprising the generally horizontally extending upper and lower beams 28, 30 and the vertically extending side pieces 32. This rigid, generally rectangular structure provides side-to-side stability and strength, thus virtually eliminating one function that the edge flanges 46 of the side panels 12 might play in providing such structural characteristics as in the carrier described in U.S. Pat. No. 4,385,781. However, the side panels 12 do provide stability and strength in the front-to-back direction as seen in FIG. 1.

More generally, the panels provide in the carrier rigidity in the direction between the front and back edges of each while the frames provide rigidity in the carrier between respective front edges and respective back edges of the panels.

Therefore, the assembled carrier 10 of the invention exhibits great structural integrity enabling it to withstand large vertical load, for example, resulting from vertical stacking of many carriers, one on another, without side-to-side or front-to-back vertical collapse.

Figure 5:
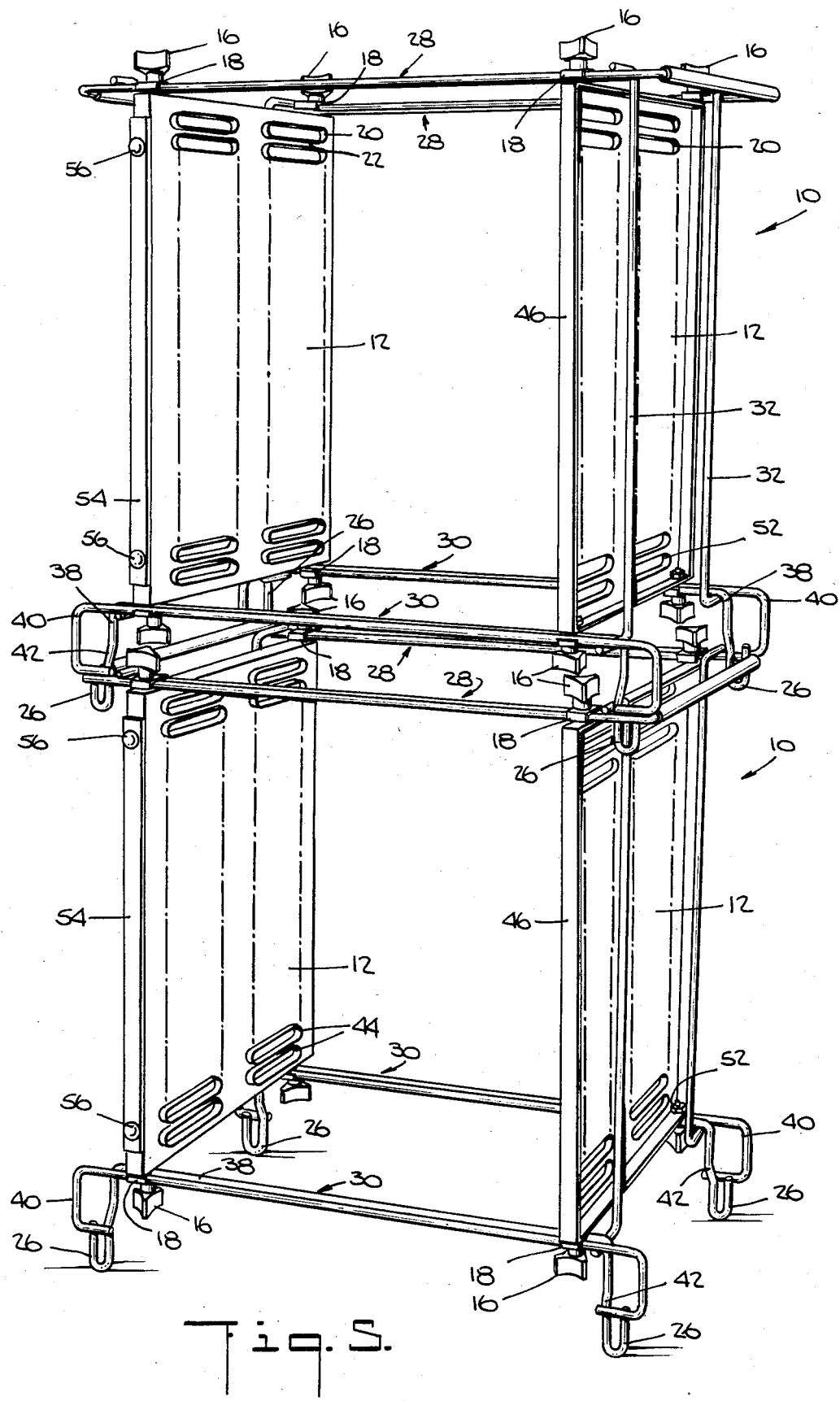
FIG. 5 is a perspective view of two carriers such as are shown in FIG. 1 stacked vertically one on the other.

FIGS. 5 and 6 show the feature of the embodiment of FIG. 1 that permits vertical stacking of a number of carriers to take advantage of the great structural stability of the carrier 10 of the present invention. As can be seen, the upper and lower portions of the support frames 14 are shaped so that the feet 26 of the frames 14 of the upper carrier extend between and engage the upper outer rails 36 of the frames 14 of the lower carrier. In addition, the lowermost inwardly bent portion of the lower outer rails 40 of the upper carrier rest directly on the upper outer rails 36 of the lower carrier. This nesting ensures secure stacking.

Figure 7:
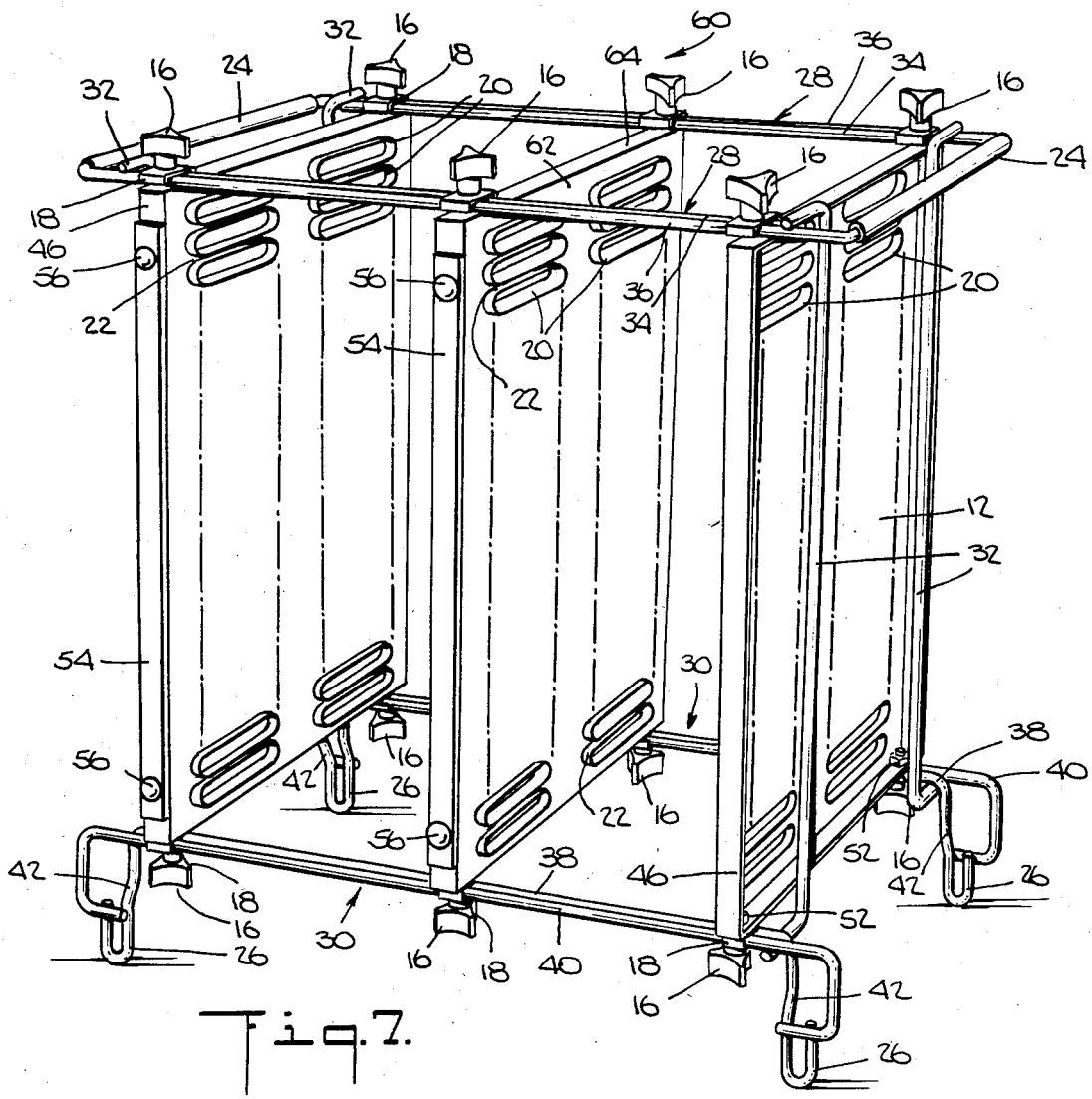
FIG. 7 is a perspective view of a second embodiment of a carrier according to the present invention, equipped with a middle panel.

FIG. 7 shows another embodiment 60, which is similar to that of FIG. 1 except that a third louvered panel 62 is provided between the two side panels 12. The middle panel 62 in this embodiment is like the side panels 12, except that it has two spaced-apart faces in which slots 22, defined by the louvers 20, can receive PCB's. Edge surfaces 64 corresponding to the peripheral edge flanges 46 of the side panels 12 connect the two faces in which the louvers 20 are formed. The middle panel 62 is secured to the frames 14 by means of screw assemblies of the same type as those used to join the side panels 12 to the frames 14. Therefore, the middle panel 62 can be slid along the rails defined by the upper and lower beams 28, 30 of the support frames 14 in the same manner as the side panels 12 can be to adjust for various lengths of PCB's accommodated in each portion of the carrier 60.

In the embodiment of FIG. 7, the middle panel 62 preferably has retainer strips 54, as described above, on both the front and the back edge surfaces 64. In the version shown, the retainer strips 54 at the front of the figure are movable to the right to hold PCB's in place, while the retainer strips (not shown) on the back of the carrier are movable to the left (as seen in FIG. 7) for the same purpose.

FIG. 8 shows another variation 70 of the invention, in which the PCB's are stored vertically rather than horizontally. Accordingly, the vertical portions of each support frame 72 comprise double-wire guide rails 74, while the top and bottom portions 76, 78 are single connective pieces similar to the vertical side pieces 32 of the embodiment of FIG. 1. Feet 80 are formed at the corners of the carrier 70 by bending the ends of the lower portion 78. The feet 80 are perferably formed with dog-leg bends so that the feet 80 are in a plane parallel to that of the major portion of the lower beam 78, and so that the feet 80 can nest with the upper beams 76 of a second such carrier 60 to enable vertical stacking. The lower beams 78 are shown as being continuous with the forward rails of the side beams 74, although the lower beams 78 could instead be separate pieces.

The carriers of all of the depicted embodiments are adapted to be coupled together side by side with identical carriers, with corresponding side and middle panels in coplanar relation, to accommodate PCB's of a greater depth than can be received in a single carrier. The coupling can be effected by joining together the guide rails of the adjacent carriers in any suitable manner, or by means of coupling strips such as are disclosed in the above-mentioned Welsch patent.

Although wire is the preferred material for the frames in the illustrated embodiments, any other material of suitable rigidity and strength could be used instead. It is noted, however, that wire is preferred because of the ease with which it can be formed to fabricate the frames of the carrier of the invention.

Although the present invention has been described in detail with regard to several preferred embodiments, many additional modifications and variations thereof will be apparent to those skilled in the art. Accordingly, the scope of the invention is to be determined, not by the details of the illustrative embodiments described herein, but solely by the terms of the appended claims.

What is claimed is:

1. A carrier for self-supporting, sheet like, generally planar articles such as printed circuit boards and the like, said carrier being readily disassemblable for storage and assemblable for use and comprising:

first and second independent frames each defining a rigid structure generally lying in one plane, said rigid structure of at least one of said frames defining an opening sufficiently large to permit an article to pass therethrough;

first and second panels each defining a rigid structure lying generally in one plane and having front and back edges, said panels including support elements for receiving and supporting the edges of articles inserted between said panels in the direction from said front edges toward said back edges thereof; and means for readily coupling and decoupling said panels to and from said frames with said frames in generally mutually parallel spaced relation and said panels in generally mutually parallel spaced relation, and with the planes defined by said panels extending generally perpendicularly to the planes defined by said frames, said panels being coupled to said frames by said coupling means such that said support elements are positioned to receive and support edges of articles passed through said opening in said one frame and to position said articles in generally mutually parallel relation with the planes thereof in generally perpendicular relation to the respective planes of both said frames and said panels;

whereby in the assembled condition of said carrier, said frames, said panels, and said articles respectively provide rigidity in three mutually perpendicular planes.

2. The carrier as set forth in claim 1, wherein each of said frames comprises a top and a bottom frame element each having opposing extremes, and a pair of side frame elements each connecting one extreme of said top element and a corresponding extreme of said bottom element.

3. The carrier as set forth in claim 2, wherein each of said bottom frame elements includes feet for supporting said carrier.

4. The carrier as set forth in claim 2, wherein each of said frames includes a stacking element at a lower portion thereof for engaging the upper portion of an identical carrier to enable secure stacking.

5. The carrier as set forth in claim 1, wherein each of said panels has a top and a bottom edge, and wherein said coupling means couples each of said frames to said panels to support said panels at both said top edge and at said bottom edge of each of said panels.

6. The carrier as set forth in claim 1, further comprising a handle supported by both of said frames.

7. The carrier as set forth in claim 6, wherein said handle comprises a tube, and wherein each of said frames comprises a handle supporting element projecting toward the other of said frames, said tube fitting over and being supported by said handle supporting elements, said tube providing additional front-to-back rigidity in said carrier.

* * * * *